Aug. 27, 1968 F. T. INACKER 3,399,371

CONNECTOR FOR THIN FILM CIRCUITS

Filed April 15, 1966 2 Sheets-Sheet 1

INVENTOR.
FREDERICK T. INACKER

BY

Caesar, Rivise, Bernstein & Cohen

ATTORNEYS.

CONNECTOR FOR THIN FILM CIRCUITS

INVENTOR.
FREDERICK T. INACKER
BY
Caesar, Rivise, Bernstein & Cohen
ATTORNEYS.

3,399,371

CONNECTOR FOR THIN FILM CIRCUITS

Frederick T. Inacker, Philadelphia, Pa., assignor to Elco Corporation, Willow Grove, Pa., a corporation of Delaware Filed Apr. 15, 1966, Ser. No. 542,823
6 Claims. (Cl. 339—17)

ABSTRACT OF THE DISCLOSURE

This invention relates to a connector for thin film circuits, and more particularly, a device which supplies terminating means for thin film substrates, while at the same time supplying mechanical support for the substrate in the area of termination.

Although relatively new in the art, thin film circuits are now widely used in the electronics industry. These circuits comprise a relatively small thermal resistant substrate, such as ceramic or glass, and an extremely thin film of electronic components and circuitry vapor deposited on the surface of the substrate. The substrates generally have a thickness of approximately 0.032 inch. The films, which are vapor deposited, have a thickness which is in the order of microns and, therefore, do nothing to significantly affect the overall thickness of the substrate.

The thin films possess a number of advantages over printed circuit boards. Thus, the thin films have smaller and thinner substrates. Additionally, the thin films comprise circuitry and components, since the technology has developed to a state where capacitors, resistors and inductors can be vapor deposited along with the circuitry. With printed circuit boards, only circuitry is printed on the substrate.

Although thin films have been found to be extremely useful in the electronics art, a problem has developed with respect to the connection of these films with other circuitry in a product. Thus, care must be taken in connecting external leads in view of the fact that the substrate comprises a relatively brittle, thin ceramic material. Ceramic is generally used because of the high temperature stability needed for the substrate during the vapor deposition of the films. Attempts to terminate the thin film in the past have included the use of relatively rigid wires crimped against the edge of the substrates. Thus, the thin film circuitry would terminate at spaced points along the edge of the substrate and the wires would be crimped in the same spacing. After the wires were crimped, they were passed under the substrate and were glued to the back of the substrate. Obviously, this was a very time-consuming method.

Another method of termination was to drill a series of spaced holes through the substrate. Thereafter, wires would be passed upwardly through these holes and wrapped around the edge of the substrate while passing over the terminated ends of the film circuitry. Again the wires would be adhesively secured to the back of the substrate.

It is thus seen that in order to effectively terminate the circuits of a thin film it is necessary to have physical contact with external leads, and in addition, means for securing the external leads to the substrate. A device for effectively accomplishing the supplying of terminals to a thin film and the supporting of the films with the terminals in place, while at the same time obviating the problems of the prior art wiring connection, is disclosed in co-pending application Ser. No. 441,028, filed Mar. 19, 1965. In the co-pending application Ser. No. 441,028 the device disclosed comprises an insulating casing with spaced contact means secured within the casing. The contact means are molded in place within the casing and have forwardly projecting blades extending from the casing. A thin film circuit will be maintained between outwardly projecting tabs formed on the casing and the blades of the contact means.

In the device disclosed in application Ser. No. 441.028 there is a full complement of contacts. Thus, there are equally spaced contacts extending along the entire length of the insulating housing. In one embodiment of the prior device, the contacts are on 0.100 inch centers. When other centers are to be used, such as 0.050 inch centers, it is necessary to mold a new device with the contacts on these centers. The device of this invention includes an insulating casing containing equally spaced slots for the selective installation of contacts. Thus, a single casing is used and the contacts are inserted and secured within the casing along any desired centers.

It is therefore an object of this invention to provide a novel connector for thin film circuits.

It is another object of this invention to provide a connector for thin film circuits which automatically provides a securement of contact leads to the thin film circuits.

It is a further object of this invention to provide a connector for thin film circuits which will simultaneously connect external leads to the thin film circuits and support the substrate of the thin film circuits.

It is a further object of this invention to provide a connector for thin film circuits which includes selectively insertable contact means for contacting leads on a thin film circuit.

These and other objects of this invention are accomplished by providing a connector for thin film circuits comprising an insulating casing, spaced contact means secured within said casing and projecting out of said casing, said contact means being selectively and releasably secured within said casing, said contact means having surfaces adapted to physically contact spaced circuits of said thin film circuit, and means on said casing adapted to maintain said thin film circuit in contact with said contacts.

Other objects and many of the attendant advantages of this invention will be readily appreciated as the same becomes better understood by reference to the following detailed description when considered in connection with the accompanying drawings wherein.

Figure 1:
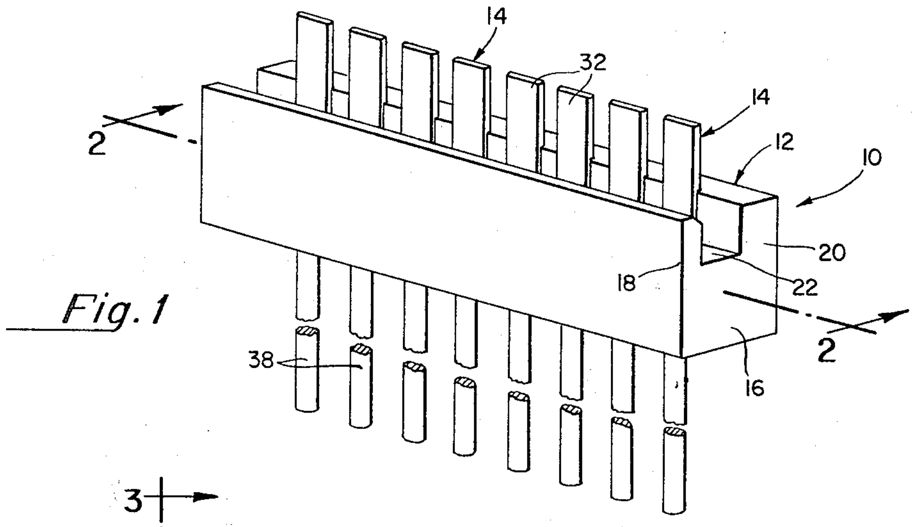
FIG. 1 is a perspective view of the connector of this invention.

Referring now in greater detail to the various figures of the drawings wherein similar reference characters refer to similar parts, a connector for thin film circuits embodying the present invention is generally shown at 10 in FIG. 1. Device 10 basically comprises an insulating casing 12 and a plurality of contacts 14 releasably secured and mounted therein.

Figure 3:
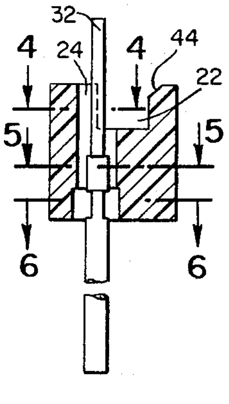
FIG. 3 is a sectional view taken along the line 3—3 of FIG. 2.
Figure 4:
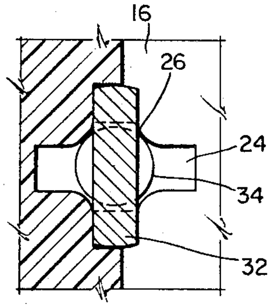
FIG. 4 is an enlarged sectional view taken along the line 4—4 of FIG. 3.

Insulator 12 is a unitary block of resilient plastic and includes a base 16. Spaced vertical walls 18 and 20 project upwardly from base 16 and form a laterally extending recess 22. As seen in FIG. 4, base 16 includes a first slot 24 formed therein and a second slot 26 formed therein. Slots 24 and 26 project at right angles to each other and intersect. Slots 24 and 26 also project upwardly through wall 20, as is apparent in FIGS. 3 and 4.

Figure 2:
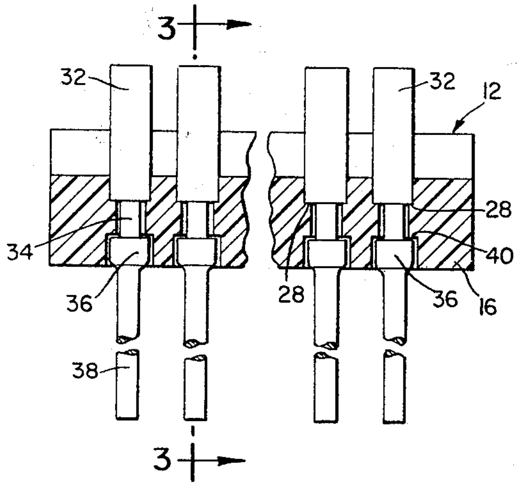
FIG. 2 is a partial sectional view taken along the line 2—2 of FIG. 1.

The width of each slot 26 is reduced in the central portion of base 16 to form a shoulder 28 (FIG. 2). However, as is apparent in FIG. 3, slot 24 maintains a constant width through the reduced area of shoulder 28. Below the reduced area of shoulder 28 an enlarged circular recess 30 is formed. The diameter of recess 30 is approximately the same as the width of slots 24 or 26. Recess 30 is formed in the lower surface of base 16 and is readily accessible from the exterior of base 16.

Figure 7:
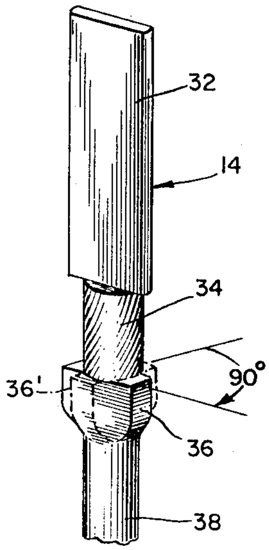
FIG. 7 is a perspective view of a contact used in the connector of this invention.
Figure 6:
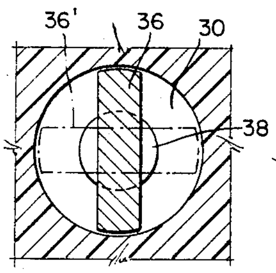
FIG. 6 is an enlarged sectional view taken along the line 6—6 of FIG. 3.
Figure 5:
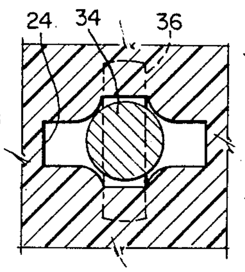
FIG. 5 is an enlarged sectional view taken along the line 5—5 of FIG. 3.

As best seen in FIG. 4, each contact 14 includes a forward bladed portion 32; a middle body portion having a cylindrical forward part 34, and a lower part comprised of a laterally extending tab 36; and a cylindrical tail 38 projecting from the bottom of tab 36. In the final assembled condition, tab 36 will lie in the same plane as bladed portion 38. However, as will be explained hereinafter, when contacts 14 are inserted in insulating casing 12, tab 36 will lie in a plane perpendicular to the plane of blade 32, as shown at 36' in FIG. 7.

Insulating housing 12 is molded from a plastic. Any electrically insulating material can be used, however, For instance, the plastics which may be used are phenolic resins, such as Bakelite, epoxy resins, polysulfone resins or nylon resins. Where desired, the resins may be reinforced as by fiber glass.

The contacts of this invention are made of any twistable electrically conductive material. For instance, soft brass or Phosphor bronze may be used. Each contact 14 is formed from cylindrical stock with the flattened portions 32 and 36 formed by a coining or swaging operation. After portions 32 and 36 have been flattened, the sides are trimmed to maintain the width of the flattened portions to be substantially the same as the width of slots 24 and 26.

In use, contacts 14 are inserted through slots 24 and 26, with the blade portion 32 being positioned in slots 26. During the insertion process, tab 36 will be in a plane which is perpendicular to blade 32, as shown at 36' in FIG. 7, and will therefore pass through slot 24 to recess 30. During the insertion process, blade 32 will be pushed downward until its lower edge abuts shoulder 28, as seen in FIG. 2. After the insertion has been completed, each contact 14 is locked in place by twisting tab 36 to the position shown in full line in FIG. 7. When in this position, the upper edge of tab 36 will abut the reduced area forming shoulder 28. Thus, a second lower shoulder 40 will be formed in casing 12. Since the contact 14 is formed from a soft metal, the rotation of tab 36 is easily accomplished by the twisting of the cylindrical forward part of body portion 34. During this twisting motion, blade 32 will be held rigidly in place by engagement with wall 20, as best seen in FIG. 4.

It is thus seen that the contacts of this invention can be selectively inserted in any slot formed in casing 12. Additionally, if it should ever become necessary to remove a contact from any given slot, this can easily be accomplished by twisting tab 36 to the position shown at 36' in FIG. 7 and pulling the contact vertically upward. Thus, if a contact should ever be damaged it can easily be replaced.

One of the features of this invention is the fact that a single casing 12 can be used regardless of the spacing of leads on a thin film circuit. Thus, in the device shown in aforementioned co-pending application Ser. No. 441,028, the contacts are permanently molded in place. A single connector must be made for each variation in spacing for the leads on a thin film circuit. Thus, one connector will have contacts on 0.050 inch centers and a second connector will have contacts on 0.100 inch centers. In the device of this invention, the slots will be placed on 0.050 inch centers. When the thin film circuit will have its leads on the same centers, a full complement of contacts 14 will be used, as shown in FIG. 1. However, when the thin film circuit has its leads on 0.100 inch centers, contacts 14 will only be inserted in every other slot, such as shown in FIG. 8.

It is thus seen that the user or manufacturer of the connector of this invention need only store a single insulating housing 12. Contacts 14 are inserted according to the spacing required for any given thin film circuit. The contacts are easily secured in place through the twisting motion described above. This twisting is carried out with no difficulty in view of the fact that tabs 36 are easily accessible through recesses 30.

Figure 8:
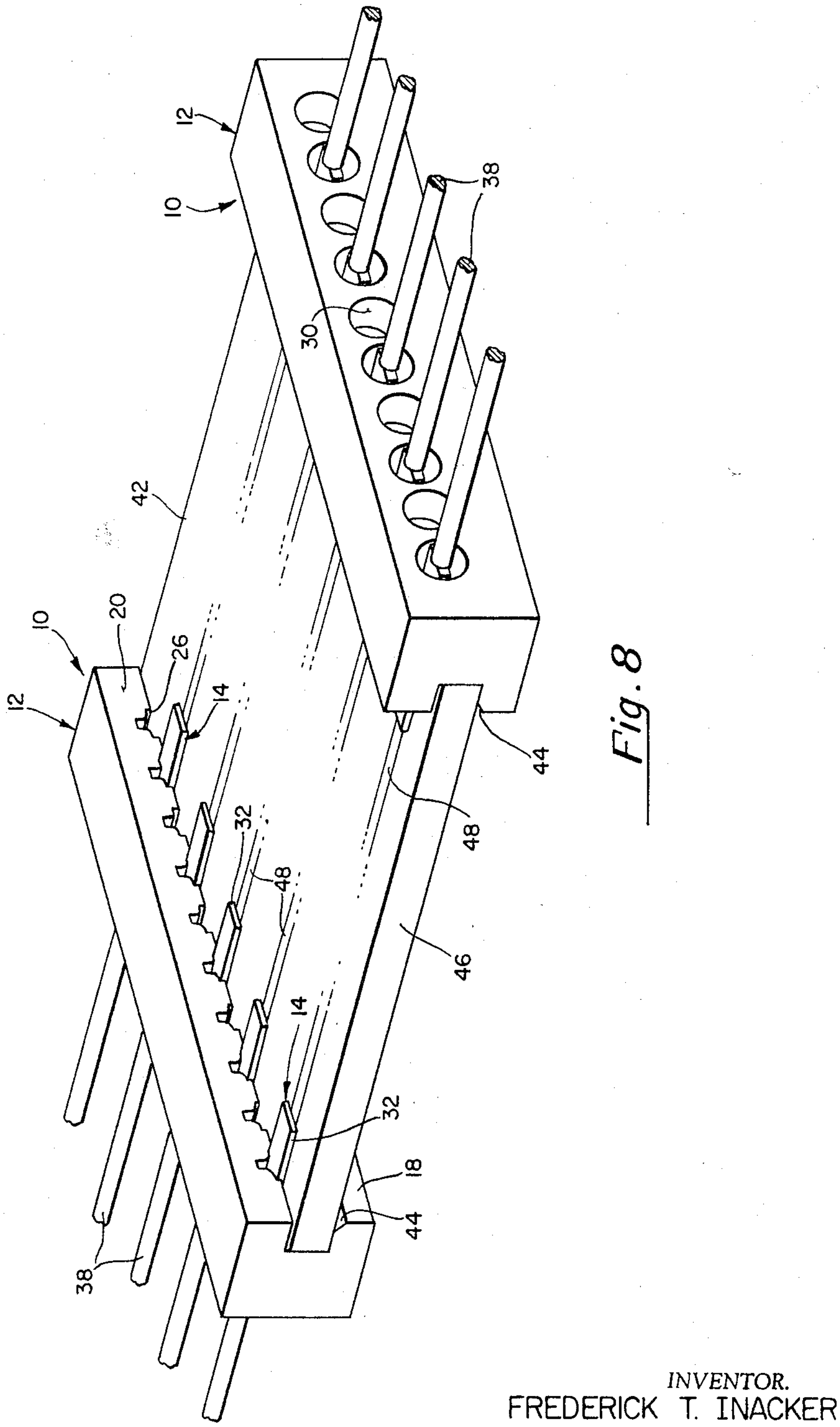
FIG. 8 is a perspective view showing the use of the connector of this invention on a thin film circuit.

The use of the connector of this invention is shown in FIG. 8. A thin film circuit is shown schematically at 42 in FIG. 8. As pointed out above, the leads on this circuit are on 0.100 inch centers. Therefore, contacts 14 are placed in every other slot 26 in housing 12.

The thin film circuit is inserted into the connector by sliding the same into recess 22. A bevelled edge 44 is formed on wall 18 to aid in the insertion. With the thin film circuit inserted in the connector, the substrate 46 will be physically supported on wall 18. A resilient grip is placed against the substrate by the engagement of bladed portions 32 of contacts 14 against the top surface of the substrate and on the circuitry leads 48 of the thin film circuit. Thus, the height of recess 22 is approximately the same as the height of the thin film circuit 46.

After the thin film circuit has been secured in place in the manner shown in FIG. 8, the contacts 14 can be permanently secured to the circuitry with which they are in contact. This securement can be accomplished by any of the means known to the art for securing contacts in place. Thus, the contacts can be bar soldered. This is accomplished by providing the ends of blades 32 with a solder plating. With the blades in the position shown in FIG. 8, a heated bar is placed across their top surfaces. This bar will cause the solder plating on the contacts to fuse with the metal of the circuitry leads 48. Another method of securing the contacts in place is welding. This can be accomplished in view of the fact that the substrate 46 of the thin film circuit comprises a temperature resistant ceramic, and therefore a welding technique would not cause any damage to the thin film circuit. When welding is used, the housing 12 should be formed from a thermosetting plastic, such as an epoxy resin.

The device of this invention is shown in FIG. 8 as being used for termination of a thin film circuit 42 on a pair of opposed sides of the circuit. Wherever termination will be carried out on only one side, obviously one of the connectors 10 can be eliminated. However, the remaining connector will still function in the manner described.

The device of this invention enjoys all of the advantages of the device disclosed and claimed in the aforementioned co-pending application Ser. No. 441,028. Thus, the device can be used for a temporary securement with a thin film circuit in order to test the thin film circuit. When a temporary securement is carried out, there will be no permanent securing process associated with blades 32. Thus, the thin film circuit will merely be inserted in place in the manner shown in FIG. 8 and will later be withdrawn by pulling it outwardly from insulating housing 12.

Another advantage of the device of this invention is the fact that there will be no lateral movement between the contacts 14 and the vapor deposited film of the thin film circuit once the device of this invention has been secured in place. The prior art problem of securing wires arose from the fact that the wires secured to the thin film circuit would tend to move after they had been so secured. This in turn caused damage to the extremely thin vapor deposited films and therefore destroyed the efficiency or usability of the thin film circuits.

The one main advantage of the device of this invention over that disclosed in co-pending application Ser. No. 441,028 is the fact that the contacts may be selectively inserted within casing 12. As pointed out above, this permits the use of a single casing regardless of the spacing that will be used in connection with any given thin film circuit. Once the spacing has been determined the contacts 14 are easily inserted and secured within the casing 12. The number of slots and contacts in the casing can be varied to suit the needs of the user.

Obviously many modifications and variations of the present invention are possible in the light of the above teachings. It is, therefore, to be understood that within the scope of the appended claims, the invention may be practiced otherwise than as specifically described.

What is claimed as the invention is:

1. A connector for thin film circuits comprising a contact and an insulated casing; said contact having a forwardly directed nose portion in the form of a flat blade connected to a rearwardly directed tail portion by a middle body portion, said body portion having a forward part and a rearward part, said blade having edges which project beyond the forward part of the body portion to define rearwardly facing shoulders at the junction between the blade and the forward part of said body portion, the rearward part of the body portion being in the form of a flattened tab which has edges that project beyond the forward part of the body portion to define forwardly facing shoulders at the junction between the tab and the forward part of said body portion, said tab being normally perpendicular to the blade and rotatable out of perpendicular relationship with the blade when the tail portion is twisted relative to the blade; said casing having a first slot which passes through said casing from the upper to the lower surface thereof, said casing having an upper shoulder and a lower shoulder associated with said first slot, said contact being positioned within said casing with the tab of said contact in said first slot, the forwardly facing shoulders on said tab being even with the lower shoulder, and the rearwardly facing shoulders on said blade resting on said upper shoulder, said casing further including means engaged with said blade for holding the blade against rotation when the tail is twisted to permit the tab to be twisted out of perpendicular relationship with the blade and thus cause the forwardly facing shoulders on the tab to overlie the lower shoulder and secure the contact to the casing.

2. The invention of claim 1 wherein the casing has a second slot which is perpendicular to the first slot and which starts in the upper surface of the casing and passes only partially therethrough; and the bottom of the second slot defines said upper shoulder and the sides of the second slot engage the blade and prevent its rotation when the tail is twisted.

3. The invention of claim 2 including a counter-bored recess aligned with the slots and formed in the lower surface of the casing, the bottom of the recess defining the lower shoulder.

4. The invention of claim 1 wherein: the casing has an elongated base and at least one elongated integral vertical wall on the upper surface of the base; the first slot extends through both the wall and the base and is elongated in a direction perpendicular to the wall; and the second slot is at least partially contained in the wall and is elongated in a direction parallel to the wall.

5. The invention of claim 1 including additional sets of slots provided in the wall and the base.

6. The invention of claim 5 in combination with a substrate having a thin film circuit thereon with regularly spaced conductive paths connected thereto extending to an edge of the substrate, the invention including vertical walls on the upper side of the base defining an elongated recess that receives the edge of the substrate having the conductive paths thereon; and the spacing of the conductive paths on the substrate being an integral multiple of the spacing of the sets of slots.

References Cited

UNITED STATES PATENTS

| | | | |
|---|---|---|---|
| 2,039,957 | 5/1936 | Hall | 339—220 |
| 2,664,552 | 12/1953 | Ericsson et al. | 339—220 |
| 3,071,750 | 1/1963 | Heselwood | 339—273 |
| 3,114,586 | 12/1963 | Albert | 339—220 |
| 3,178,672 | 4/1965 | Batcheller | 339—220 |
| 3,245,024 | 4/1966 | Evans | 339—220 |
| 3,249,908 | 5/1966 | Fuller et al. | 339—247 |
| 2,457,520 | 12/1948 | Benander | 339—220 |

FOREIGN PATENTS 997,204 7/1965 Great Britain.

MARVIN A. CHAMPION, *Primary Examiner.*

R. S. STROBEL, *Assistant Examiner.*